(12) United States Patent
Matsushita et al.

(10) Patent No.: US 7,238,879 B2
(45) Date of Patent: Jul. 3, 2007

(54) SOLAR CELL MODULE

(75) Inventors: Masaaki Matsushita, Shiga (JP); Akiharu Takabayashi, Shiga (JP); Shigenori Itoyama, Shiga (JP); Ichiro Kataoka, Shiga (JP); Hidehisa Makita, Shiga (JP); Takaaki Mukai, Shiga (JP); Toshihiko Mimura, Shiga (JP)

(73) Assignee: Canon Kabushiki Kaisha, Tokyo (JP)

( * ) Notice: Subject to any disclaimer, the term of this patent is extended or adjusted under 35 U.S.C. 154(b) by 89 days.

(21) Appl. No.: 10/992,706

(22) Filed: Nov. 22, 2004

(65) Prior Publication Data
US 2005/0133083 A1    Jun. 23, 2005

(30) Foreign Application Priority Data
Dec. 19, 2003    (JP)    ............................. 2003-422102

(51) Int. Cl.
*H01L 3/042*    (2006.01)
*H01L 31/00*    (2006.01)
*E04D 13/18*    (2006.01)
*E04H 14/00*    (2006.01)

(52) U.S. Cl. ................. 136/251; 136/259; 52/173.3

(58) Field of Classification Search ............... 136/244, 136/251, 256, 246, 259; 257/433, 464; 52/173.3
See application file for complete search history.

(56) References Cited

U.S. PATENT DOCUMENTS

| | | | |
|---|---|---|---|
| 5,397,401 A | 3/1995 | Toma et al. | 136/259 |
| 5,578,141 A | 11/1996 | Mori et al. | 136/251 |
| 5,589,006 A | 12/1996 | Itoyama et al. | 136/248 |
| 5,660,646 A | 8/1997 | Kataoka et al. | 136/251 |
| 5,684,325 A | 11/1997 | Kataoka et al. | 257/433 |
| 5,718,772 A | 2/1998 | Mori et al. | 136/251 |
| 5,800,631 A | 9/1998 | Yamada et al. | 136/251 |
| 5,849,107 A | 12/1998 | Itoyama et al. | 136/248 |
| 5,973,258 A | 10/1999 | Shiotsuka et al. | 136/252 |
| 5,998,729 A | 12/1999 | Shiomi et al. | 136/251 |

(Continued)

FOREIGN PATENT DOCUMENTS

| | | |
|---|---|---|
| JP | 6-291350 | 10/1994 |
| JP | 2000-196129 | 7/2000 |
| JP | 2000-244001 | 9/2000 |
| JP | 2002-9325 | 1/2002 |
| JP | 2002-252362 | 9/2002 |

OTHER PUBLICATIONS

Machine English translation of JP 6-291350, Oct. 1994.*

*Primary Examiner*—Nam Nguyen
*Assistant Examiner*—Luan V. Van
(74) *Attorney, Agent, or Firm*—Fitzpatrick, Cella, Harper & Scinto

(57) ABSTRACT

Provided is a solar cell module having a reinforcing member integrally stacked by means of a covering material on a rear surface of a solar cell panel having a photovoltaic element that performs photoelectric conversion, wherein a bent portion is formed in each of opposing end portions of the reinforcing member, an output wire member having conductivity is extended from an output portion of the photovoltaic element disposed on a light-receiving surface side of the solar cell panel along a surface of the bent portion so as to get over the bent portion, and a tip end of the extended portion of the output wire member is exposed out of a surface opposite to the reinforcing member of the covering material to form an output terminal portion. Thereby, there is provided a solar cell module that is improved in the area efficiency and weather resistance as well as the workability of electrical wiring and electrical connection during manufacturing and is inexpensive.

6 Claims, 7 Drawing Sheets

U.S. PATENT DOCUMENTS

| | | | |
|---|---|---|---|
| 6,018,123 A | 1/2000 | Takada et al. | 136/248 |
| 6,034,323 A | 3/2000 | Yamada et al. | 136/259 |
| 6,063,996 A | 5/2000 | Takada et al. | 136/246 |
| 6,075,202 A | 6/2000 | Mori et al. | 136/251 |
| 6,093,884 A | 7/2000 | Toyomura et al. | 136/244 |
| 6,113,718 A | 9/2000 | Yamada et al. | 156/78 |
| 6,128,868 A | 10/2000 | Ohtsuka et al. | 52/173.3 |
| 6,133,522 A | 10/2000 | Kataoka et al. | 136/259 |
| 6,162,986 A | 12/2000 | Shiotsuka et al. | 136/244 |
| 6,175,075 B1 | 1/2001 | Shiotsuka et al. | 136/251 |
| 6,182,403 B1 | 2/2001 | Mimura et al. | 52/173.3 |
| 6,218,609 B1 | 4/2001 | Mori et al. | 136/259 |
| 6,245,987 B1 | 6/2001 | Shiomi et al. | 136/244 |
| 6,265,242 B1 | 7/2001 | Komori et al. | 438/66 |
| 6,291,761 B1 | 9/2001 | Takada et al. | 136/244 |
| 6,294,724 B1 | 9/2001 | Sasaoka et al. | 136/251 |
| 6,307,144 B1 | 10/2001 | Mimura et al. | 136/244 |
| 6,307,145 B1 | 10/2001 | Kataoka et al. | 136/251 |
| 6,320,115 B1 | 11/2001 | Kataoka et al. | 136/251 |
| 6,323,416 B1 * | 11/2001 | Komori et al. | 136/259 |
| 6,323,478 B1 | 11/2001 | Fujisaki et al. | 250/214 |
| 6,331,671 B1 | 12/2001 | Makita et al. | 136/244 |
| 6,336,304 B1 * | 1/2002 | Mimura et al. | 52/748.1 |
| 6,414,236 B1 | 7/2002 | Kataoka et al. | 136/251 |
| 6,437,235 B1 | 8/2002 | Komori et al. | 136/251 |
| 6,515,215 B1 | 2/2003 | Mimura | 136/244 |
| 6,515,216 B2 | 2/2003 | Zenko et al. | 136/244 |
| 6,521,821 B2 | 2/2003 | Makita et al. | 136/244 |
| 6,534,702 B1 | 3/2003 | Makita et al. | 136/244 |
| 6,545,211 B1 | 4/2003 | Mimura | 136/244 |
| 6,546,535 B1 | 4/2003 | Nagao et al. | 716/11 |
| 6,613,973 B2 | 9/2003 | Mukai et al. | 136/255 |
| 6,653,549 B2 | 11/2003 | Matsushita et al. | 136/244 |
| 6,664,597 B2 | 12/2003 | Takeyama et al. | 257/347 |
| 6,676,459 B2 | 1/2004 | Mukai et al. | 439/884 |
| 6,693,237 B2 | 2/2004 | Yamada et al. | 136/251 |
| 6,703,555 B2 | 3/2004 | Takabayashi et al. | 136/244 |
| 6,800,801 B2 | 10/2004 | Sasaoka et al. | 136/246 |
| 6,803,515 B2 | 10/2004 | Itoyama et al. | 136/251 |
| 6,806,414 B2 | 10/2004 | Shiotsuka et al. | 136/256 |
| 6,806,415 B2 | 10/2004 | Fujisaki et al. | 136/259 |
| 6,812,396 B2 | 11/2004 | Makita et al. | 136/244 |
| 6,818,820 B2 | 11/2004 | Matsushita et al. | 136/251 |
| 6,884,934 B2 | 4/2005 | Tsuzuki et al. | 136/244 |
| 2001/0054435 A1 | 12/2001 | Nagao et al. | 136/251 |
| 2003/0049881 A1 | 3/2003 | Takada et al. | 438/62 |
| 2003/0234038 A1 | 12/2003 | Kurokami et al. | 136/255 |
| 2004/0045595 A1 | 3/2004 | Makita et al. | 136/244 |
| 2004/0159102 A1 | 8/2004 | Toyomura et al. | 60/641.8 |
| 2004/0171187 A1 | 9/2004 | Kataoka et al. | 438/64 |
| 2004/0191422 A1 | 9/2004 | Kataoka et al. | 427/553 |
| 2004/0255999 A1 | 12/2004 | Matsushita et al. | 136/244 |
| 2004/0261836 A1 | 12/2004 | Kataoka et al. | 136/244 |
| 2005/0000560 A1 | 1/2005 | Shiotsuka et al. | 136/243 |
| 2005/0000562 A1 | 1/2005 | Kataoka et al. | 136/251 |

* cited by examiner

SOLAR CELL MODULE

This application claims priority from Japanese Patent Application No. 2003-422102, filed Dec. 19, 2003, which is hereby incorporated by reference herein.

BACKGROUND OF THE INVENTION

1. Field of the Invention

The present invention relates to a solar cell module in which a reinforcing member is integrally stacked by use of a covering material on the rear surface of a solar cell panel having a photovoltaic element that performs photoelectric conversion.

2. Related Background Art

Solar cell modules have hitherto been installed in structures, such as roofs and walls, in large numbers and in various forms as photovoltaic power generation systems that compensate for household electric power supply. An improvement in area efficiency and weather resistance has hitherto been required of such solar cell modules. As means of improving area efficiency and weather resistance, it is effective that members that need not to be provided on a light-receiving surface of a solar cell module are provided on a non-light-receiving surface as far as possible. There is an output terminal, for example, as such members that need not to be provided on the light-receiving surface. By providing an output terminal on a non-light-receiving surface, which is a rear surface of a solar cell module, it becomes unnecessary to provide a dead space on a light-receiving surface and it becomes possible to improve the efficiency of the area occupied by a photovoltaic element (a solar cell) on the light-receiving surface.

Furthermore, because an output terminal is not directly exposed to sunlight, it becomes possible to prevent lowering in the insulating properties of members that constitute the output terminal due to photodegradation.

As a technique related to this, in Japanese Patent Application Laid-Open No. 2000-244001 there is disclosed a solar cell module of improved fire-preventive and fire-resistive performance having at least a solar cell and a rear surface covering material, which has such a construction that through a terminal takeout hole of the rear surface covering material provided in a portion not provided with the solar cell, the terminal is taken out by means of a conductive member electrically connected to the solar cell, and in which the conductive member covers the whole upper opening of the terminal takeout hole on the light-receiving surface of the terminal takeout hole.

Also, in Japanese Patent Application Laid-Open No. 2000-196129 there is proposed a solar-cell-integrated roofing member that is constituted by at least a solar cell and a roofing member main body. This solar-cell-integrated roofing member has a structure such that in a region where at least a photovoltaic element is not present, there is formed a step that provides a recess on a non-light-receiving surface, and terminal takeout parts of a solar cell (terminal takeout box, terminal takeout cable, connector for electrical connection) are formed in the recess of the non-light-receiving surface of the stepped part. Therefore, handling is good, installation is easy, and there is no fear of damage to the terminal takeout box during installation.

However, in the solar cell module described in Japanese Patent Application Laid-Open No. 2000-244001, a complicated step that involves providing the terminal takeout hole in the rear surface covering material and drawing out the conductive member therethrough is necessary. Therefore, workability is poor. Also, because a noncombustible member to improve fire-preventive and fire-resistive performance is provided in addition to the covering material of the solar cell module, the material cost increases. Furthermore, the step of disposing the noncombustible member is necessary during the manufacture of the solar cell module, posing the problem that the manufacturing cost also increases.

Further, in the solar cell module described in Japanese Patent Application Laid-Open No. 2000-196129, by providing the terminal takeout parts within the recess on the non-light-receiving surface of the solar cell module, damage to the terminal takeout parts is prevented and an increase in area efficiency is accomplished. However, because the terminal is taken out from the non-light-receiving surface, similarly as described above, a step becomes necessary which involves providing a through hole in a roof member, which is a rear surface reinforcing member, and component members thereof, and taking out a wiring member therethrough. Therefore, workability is poor. Also, a measure such as providing an insulating member to prevent short-circuiting in the portion where the wiring member is taken out via the through hole is necessary, posing the problem that the manufacturing cost increases.

The present inventors have conducted extensive studies for realization of a solar cell module that permits improvement in area efficiency and weather resistance and is inexpensive and considered that manufacturing a solar cell module that permits improvement in area efficiency and weather resistance at a low cost is difficult with the conventional type of solar cell modules in which the output terminal is disposed on the non-light-receiving surface.

The present invention has been accomplished in view of the above-described problems.

It is, therefore, an object of the present invention to provide a solar cell module that is improved in the area efficiency and weather resistance as well as the workability of electrical wiring and electrical connection during manufacturing and is inexpensive.

SUMMARY OF THE INVENTION

The above object is achieved in accordance with the present invention by providing a solar cell module having a reinforcing member integrally stacked by means of a covering material on a rear surface of a solar cell panel having a photovoltaic element that performs photoelectric conversion, wherein a bent portion is formed in each of opposing end portions of the reinforcing member, an output wire member having conductivity is extended from an output portion of the photovoltaic element disposed on a light-receiving surface side of the solar cell panel along a surface of the bent portion so as to get over the bent portion, and a tip end of the extended portion of the output wire member is exposed out of a surface opposite to the reinforcing member of the covering material to form an output terminal portion.

In the present invention, the constitution of the covering material that is present in a region on the light-receiving surface side of the solar cell panel is different from the constitution of the covering material that is present in a region ranging from the bent portion of the reinforcing member to the end portion of the reinforcing member.

Further, it is preferred that the covering material that is present in a region ranging from the bent portion to the end portion of the reinforcing member is thinner than the covering material that is present in a region on the light-receiving surface side of the solar cell panel.

Moreover, it is preferred that a part of the bent portion of the reinforcing member on the leading end side is further bent toward a non-light-receiving surface which is a rear surface of the solar cell panel.

Further, it is preferred that a connector cable is electrically connected to the output terminal portion, the electrical connecting portion is covered with an output terminal box, and a filler is filled in the output terminal box.

Moreover, it is preferred that the output terminal box is disposed on a non-light-receiving surface side of the solar cell panel.

The solar cell module of the invention produces excellent effects as described below.

That is, by adopting the specific feature that the bent portion is formed in each of the opposing end portions of the reinforcing member disposed on the rear surface of a solar cell panel, an output wire member having conductivity is extended from an output portion of the photovoltaic element disposed on a light-receiving surface side of the solar cell panel along a surface of the bent portion so as to get over (or extend over or cross over) the bent portion, and a tip end of the extended portion of the output wire member is exposed out of a surface opposite to the reinforcing member of the covering material to form an output terminal portion, it is unnecessary to provide a through hole to take out the output terminal in the reinforcing member and the work for drawing out the wiring member is also unnecessary, with the result that the workability of electrical wiring and electrical connection in manufacturing steps can be remarkably improved. Further, because the output terminal portion is disposed at the leading end portion of the bent portion, it is possible to reduce a dead space on the light-receiving surface side of the solar cell panel and to improve the efficiency of the area occupied by the photovoltaic element with respect to the area of the light-receiving surface of the solar cell module. Moreover, because the output wire member is disposed in the bent portion that is highly resistant to a bending stress and the output terminal portion is exposed at the leading end of the extended portion, loose contact or lowering in insulating property of electrical connecting portions and the like can be prevented even when a stress is applied to the solar cell module.

Furthermore, the constitution of the covering material that is present in a region on the light-receiving surface side of the solar cell panel may be different from the constitution of the covering material that is present in a region ranging from the bent portion of the reinforcing member to the end portion of the reinforcing member. For example, by adopting the feature that the covering material that is present in a region ranging from the bent portion to the end portion of the reinforcing member is thinner than the covering material that is present in a region on the light-receiving surface side of the solar cell panel, it is possible to reduce stresses due to bending working to the covering material in the region from the bent portion to the leading end portion and it is also possible to reduce the weight of the solar cell module.

Moreover, when a part of the bent portion of the reinforcing member on the leading end side thereof is further bent toward the non-light-receiving surface, which is the rear surface of the solar cell module, the output terminal portion that is formed by exposing the tip end of the extended portion of the wiring member extended along the bent portion so as to get over the bent portion can be positioned on the non-light-receiving surface side of the solar cell panel.

Further, when the constitution is adopted in which a connector cable is electrically connected to the output terminal portion, the electrical connecting portion is covered with an output terminal box, and a filler is filled in the output terminal box, it is possible to make the electrical connecting portion weather resistant.

In addition, because the output terminal box can be disposed on the non-light-receiving side of the solar cell panel, the output terminal portion is less susceptible to photodegradation and it is possible to keep high weather resistance for a long period of time.

Thus, according to the present invention, it is possible to provide a solar cell module that is improved in the area efficiency and weather resistance as well as the workability of electrical wiring and electrical connection during manufacturing and is inexpensive.

Other features and advantages of the present invention will be apparent from the following description taken in conjunction with the accompanying drawings.

DETAILED DESCRIPTION OF THE PREFERRED EMBODIMENTS

The preferred embodiments of the present invention will be described below with reference to the attached drawings. However, the invention is not limited to these embodiments.

Figure 1:
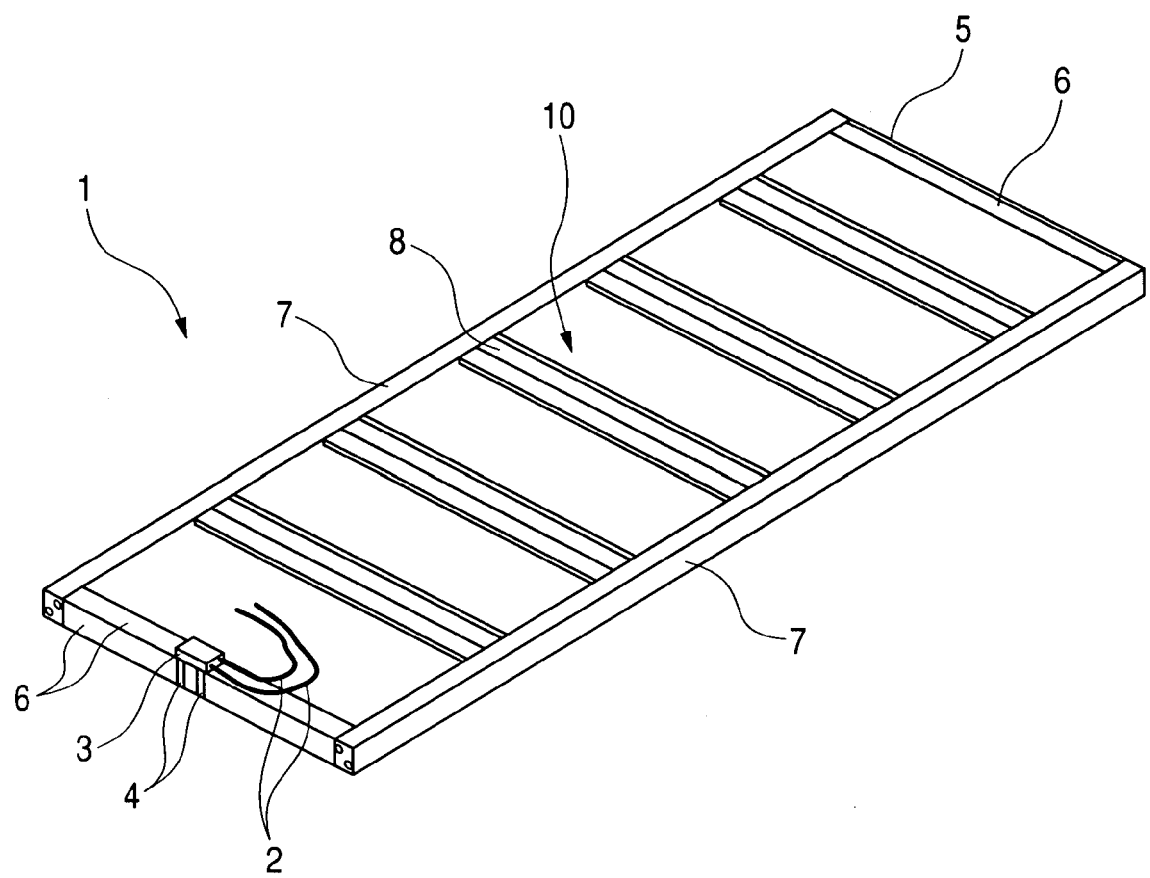
FIG. 1 is a schematic perspective view showing an embodiment of the solar cell module in accordance with the present invention in a state as viewed from the non-light-receiving side.
Figure 2:
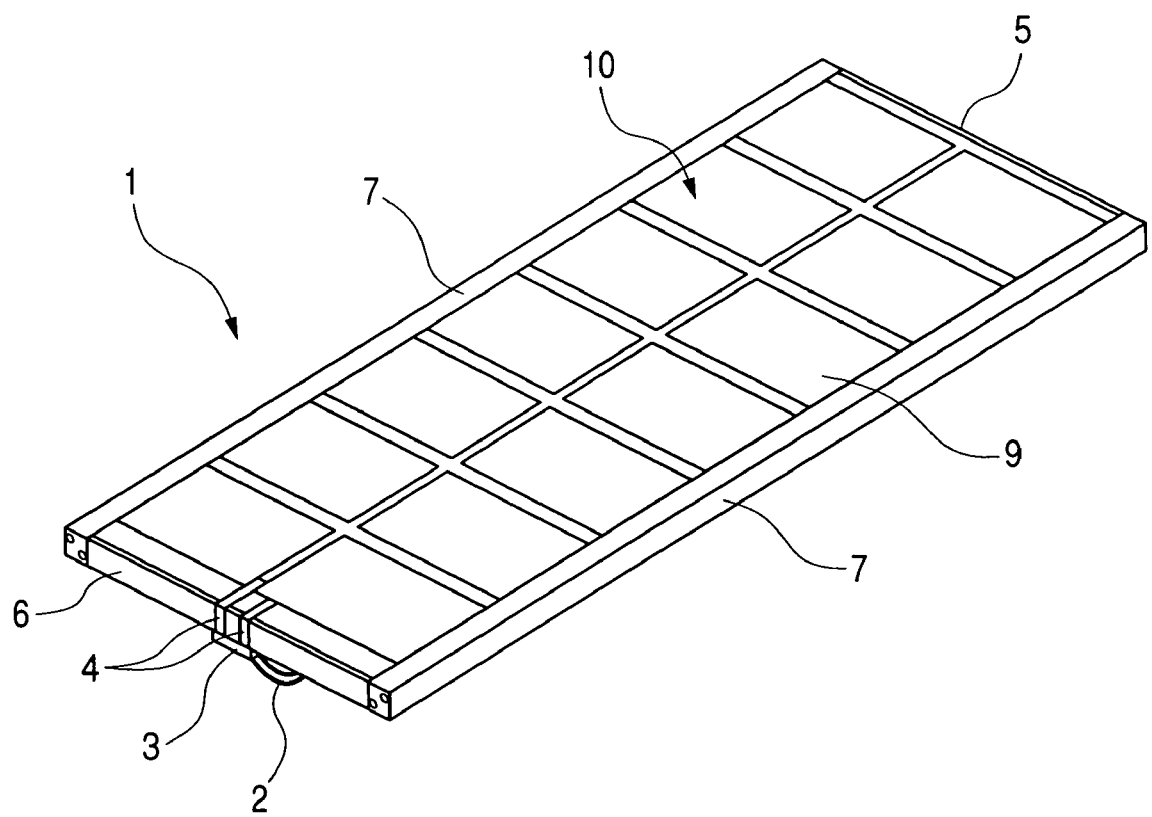
FIG. 2 is a schematic perspective view showing the above embodiment of the solar cell module in a state as viewed from the light-receiving side.
Figure 3:
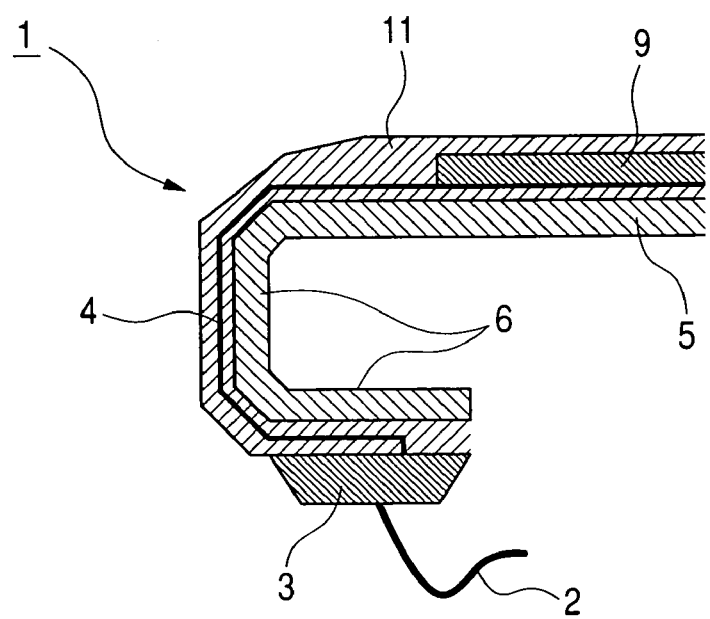
FIG. 3 is a schematic view showing a sectional structure of an output terminal portion of the solar cell module of the above embodiment.

FIG. 1 is a schematic perspective view showing an embodiment of the solar cell module in accordance with the present invention in a state as viewed from the non-light-receiving side. FIG. 2 is a schematic perspective view showing this embodiment of the solar cell module in a state as viewed from the light-receiving side. FIG. 3 is a schematic view showing the sectional structure of an output terminal portion of the solar cell module of this embodiment. In these figures, the reference numeral 1 denotes a solar cell module, the reference numeral 2 a connector cable, the reference numeral 3 an output terminal box (a junction box), the reference numeral 4 an output wire member, the reference numeral 5 a reinforcing member, the reference numeral 6 a bent portion of the reinforcing member, the reference numeral 7 a frame, the reference numeral 8 a rib, the reference numeral 9 a photovoltaic element, the reference numeral 10 a solar cell panel, and the reference numeral 11 a covering material.

In the solar cell module 1 of this embodiment, the solar cell panel 10 having the photovoltaic element 9 that performs photoelectric conversion and the reinforcing member 5 disposed on the rear surface of this solar cell panel 10 are integrally stacked by means of the covering material 11. The bent portion 6 is formed in each of the opposing end portions of the reinforcing member 5, an output wire member 4 having conductivity is extended from an output portion of the photovoltaic element 9 disposed on the light-receiving surface of the solar cell panel 10 along the surface of the bent portion 6 to the tip portion, and an edge of the extended portion of this output wire member 4 is exposed out of the covering material 11 to form an output terminal portion. The connector cable 2 is electrically connected to this output terminal portion, the electric connection is covered with the output terminal box 3, and a filler is filled in the output terminal box 3.

In this embodiment, the tip portion of the bent portion 6 of the reinforcing member 5 is further bent toward the non-light-receiving face side, which is the rear surface of the solar cell module, and the output terminal box 3 is disposed in a region of the solar cell panel 10 on the non-light-receiving surface side.

Each component element of the solar cell module 1 of this embodiment will be described in detail below.

(Solar Cell Panel)

The type of the solar cell panel 10 in the invention is not especially limited, and any solar cell panel in which the photovoltaic element 9 is sealed (encapsulated) with a weather resistant covering material and from which an electrical output can be taken out can be used. Examples of the photovoltaic elements used in the solar cell panel 10 include an amorphous-microcrystalline silicon stacked photovoltaic element, a crystalline silicon photovoltaic element, a polycrystalline silicon photovoltaic element, an amorphous silicon photovoltaic element, a copper indium selenide photovoltaic element, a compound semiconductor photovoltaic element, and the like. However, because thin-film photovoltaic elements, which have flexibility, are preferable for fabricating the solar cell module 1 so as to have a large area. In particular, a photovoltaic element in which a semiconductor active layer or the like as a photoelectric converting member is formed on a conductive substrate having flexibility is preferable because large area design is possible and the reliability of the photovoltaic element against a bending stress is high, and for example, a stacked photovoltaic element comprising an amorphous-microcrystalline silicon three-layer structure is specially preferable.

Because there is a limit to the electrical characteristics (voltage, output, etc.) of a single photovoltaic element, the plurality of photovoltaic elements 9 are electrically connected in series and in parallel and used, which is called a photovoltaic element group. Incidentally, a positive terminal and a negative terminal are present in each photovoltaic element 9 to permit series and parallel connection.

Further, in order to prevent a reverse bias from being applied to the photovoltaic elements 9 during light shielding, a bypass diode that is not shown is connected in parallel to the photovoltaic element group. As this bypass diode, an ordinary silicon rectifying diode, a Schottky barrier diode and the like are useful.

(Covering Material)

The covering material 11 is used to improve the weather resistance of the photovoltaic element 9, for example, to protect the photovoltaic element 9 from external pollution, ultraviolet light, moisture, etc. from the outside and the like. Therefore, the covering material 11 is required to have transparency, weather resistance, pollution resistance, and the like and hence fluororesins, acrylic resins, urethane resins, silicone resins, glass, or the like are advantageously used for the covering material 11. As the method of covering by use of these materials, there are included a method that involves laminating the material in a form of a film, a method that involves applying the material by coating, a method that involves bonding the material with an adhesive, and so on. Depending on the applications, the covering material 11 may be provided either on the rear surface of the solar cell panel 10 only or on both the front surface and the rear surface of the solar cell panel 10. Further, in a case where the reinforcing member 5 is disposed on the rear surface of the solar cell panel 10 and they are integrally stacked by use of the covering material 11, covering the end portions of the reinforcing member 5 with the covering material 11 makes it possible to prevent the covering material 11 from peeling off from the end portions.

When the covering material 11 is provided on the front surface and rear surface of the solar cell panel 10, the covering material 11 is constituted by, for example, a front surface member disposed on the light-receiving surface of the photovoltaic element 9, a rear surface member disposed on the non-light-receiving surface, and an encapsulant member disposed between the front surface member and the rear surface member.

The material advantageously used as the front surface member includes, but no limited to, glass plates and fluoride polymer films. As the fluoride polymer, there are available polyvinylidene fluoride (PVDF), polyvinyl fluoride (PVF), ethylene-tetrafluoroethylene copolymer (ETFE), polychlorotrifluoroethylene (PCTFE), chlorotrifluoroethylene-ethylene copolymer (ECTFE), perfluoro(alkylvinylether)-tetrafluoroethylene copolymer (PFA), hexafluoropropylene-tetrafluoroethylene copolymer (FEP), tetrafluoroethylene-hexafluoropropylene-vinylidene fluoride copolymer, mixtures of two or more kinds of them, etc. Of these polymers, ETFE is preferably used because it has excellent suitability as a front surface material of the solar cell module 1 in terms of the compatibility between weather resistance and mechanical strength and from the standpoint of transparency. Also, ETFE easily forms a reaction product on the film surface by discharge treatment, which is also one of the reasons why it is selected.

The rear surface member is used to protect the photovoltaic element 9, to prevent the entry of moisture and to keep electric insulation from the outside. As the material for this rear surface member, those materials that can ensure sufficient electric insulation, are excellent in long-period durability and can endure thermal expansion and thermal shrinkage are preferable. Examples of advantageously used materials include a polyvinyl fluoride film, a nylon film, a polyethylene terephthalate film (PET film), a glass plate, etc.

The encapsulating (or sealing) material is used to encapsulate the photovoltaic element 9, protect the element from severe outside environments such as temperature changes, humidity and mechanical impact, and ensure the adhesion of the front surface member and the rear surface member with the element. As the material for this encapsulating material, there are included ethylene-vinyl acetate copolymer (EVA) resin, ethylene-methyl acrylate copolymer (EMA) resin, ethylene-ethyl acrylate copolymer (EEA) resin, ethylene-methacrylic acid copolymer (EMAA) resin, ionomer resin, polyvinyl butyral resin, etc. Of these resins, EVA resin is advantageously used because they have well-balanced physical properties, such as weather resistance, adhesion, filling property, heat resistance, low-temperature resistance and impact resistance, for solar cell applications.

In this embodiment, the covering material 11 may have different constitutions between the region on the light-receiving surface side of the solar cell panel 10 and the region from the bent portion 6 to the leading end portion of the reinforcing member 5. For example, by forming the covering material in the region from the bent portion 6 to the leading end portion of the reinforcing member 5 in a smaller thickness, it is possible to reduce a stress due to bending working to the covering material in the region from the bent portion 6 to the leading end portion and to achieve weight reduction of the solar cell module 1.

(Reinforcing Member)

The reinforcing member 5 in the invention is a member that gives mechanical strength to the solar cell module 1 and includes, for example, a metal sheet such as a hot-dip aluminum coated steel sheet, a hot-dip zinc coated steel sheet, a hot-dip zinc-aluminum alloy coated steel sheet or a stainless steel sheet, a plastic sheet, an FRP (Fiberglass Reinforced Plastic) sheet, etc. However, a hot-dip Zn—Al alloy coated steel sheet that is excellent in weather resistance and corrosion resistance is especially preferable.

Also, by working the reinforcing member 5 in such a manner that the leading end portion of the bent portion 6 is further bent toward the non-light-receiving surface side, which is the rear surface of the solar cell panel 10, it is possible to position the output terminal portion formed by exposing the leading edge of the extended portion of the output wire member 4, which is extended to the end portion along the bent portion. 6, on the non-light-receiving surface side of the solar cell panel 10.

(Output Wire Member)

The output wire member 4 in the invention is a conductive wiring member that connects the output portion of the photovoltaic element 9 and the connector cable 2 to each other, and a bare lead wire that is not covered is preferably used. The reason is that the output wire member 4 is not covered and thin and therefore can make the covering material 11 thinner, even when embedded therein. Further, the use of a bare lead wire enables electric connection to be performed at an arbitrary position, which improves the workability of electrical connection during manufacturing. Moreover, the output wire member 4 may be either a single-core wire or a multicore wire. Furthermore, in a case where the output wire member 4 is laminated integrally with the photovoltaic element 9, a thin copper foil having flexibility can be employed to reduce lamination defects.

(Output Terminal Portion)

The output terminal portion in the invention is a terminal portion to take out the electric power generated by the photovoltaic element 9 to outside the solar cell module 1, and in order to improve the workability of electrical connection, it is preferred that a bare lead wire is used as the output wire member 4 and embedded in the covering material 11, and that at least the leading edge of the extended portion of the output wire member 4 is exposed as the output terminal portion out of the covering material 11.

(Output Terminal Box (Junction Box))

The output terminal box 3 is a box member to give weather resistance to an electrical connecting portion that is obtained by electrically connecting the connector cable 2 and the output terminal portion of the output wire member 4 to each other take out the electric power generated by the photovoltaic element 9 to outside the solar cell module. For example, a frame is provided so as to surround the electrical connecting portion and insulation is obtained by injecting a filler into the frame. It is also possible to cause this filler to play a role of an adhesive that fixes the output terminal box 3 if this filler has adhesion to the covering material 11 of the solar cell module 1. Further, when the filler itself has weather resistance, it is unnecessary to provide a lid for this frame and hence the cost therefor can also be reduced.

In this embodiment, because the leading end portion of the bent portion 6 of the reinforcing member 5 is further bent toward the non-light-receiving surface side, which is the rear surface of the solar cell panel 10, the output terminal box 3 is disposed on the non-light-receiving surface side of the solar cell panel 10, with the result that the output terminal portion is less likely to be photodegradated, thus making it possible to keep weather resistance for a long period of time.

(Bending of End Portion)

In this embodiment, in the solar cell panel 10, opposing end portions of the reinforcing member where the photovoltaic element 9 is not disposed are bent toward the non-light-receiving surface by use of a bending former. During this bending, forming is performed by paying attention so that the edge or the like of the bending former does not come into contact with the photovoltaic element and the like.

Thus, according to the solar cell module 1 of this embodiment, the bent portion 6 is formed in each of the opposing end portions of the reinforcing member 5 that is disposed on the rear surface of the solar cell panel 10, an output wire member 4 having conductivity is extended from an output portion of the photovoltaic element 9 disposed on the light-receiving surface side of the solar cell panel 10 along a surface of the bent portion 6 to the leading end portion, and an edge of the extended portion of the output wire member 4 is exposed out of the covering material 11 to form an output terminal portion. Therefore, unlike conventional techniques, it is unnecessary to provide a through hole to take out the output terminal in the reinforcing member and the work for drawing out the wiring member is also unnecessary, with the result that the workability of electrical wiring and electrical connection can be remarkably improved in the manufacturing process. Further, because the output terminal portion is disposed in the leading end portion of the bent portion 6 of the reinforcing member 5, it is possible to reduce the dead space on the light-receiving surface side of the solar cell panel 10 and to improve the area efficiency of the photovoltaic element 9 with respect to the light-receiving surface of the solar cell module 1. Moreover, because the output wire member 4 is disposed at the bent portion 6 that is highly resistant to a bending stress and the output terminal portion is exposed at the edge of the extended portion, loose contact of the electrical connecting portion, lowering in the insulating properties and the like can be prevented even when a stress is applied to the solar cell module 1.

Therefore, according to the present invention, the workability of electrical wiring and electrical connection during manufacturing can be remarkably improved and the area efficiency of the photovoltaic element 9 with respect to the light-receiving surface of the solar cell module 1 can be improved, thereby making it possible to provide a high-reliability solar dell module 1 at a low price.

Examples of the present invention will be described in detail below. However, the invention is not limited by these examples.

EXAMPLE 1

Figure 4:
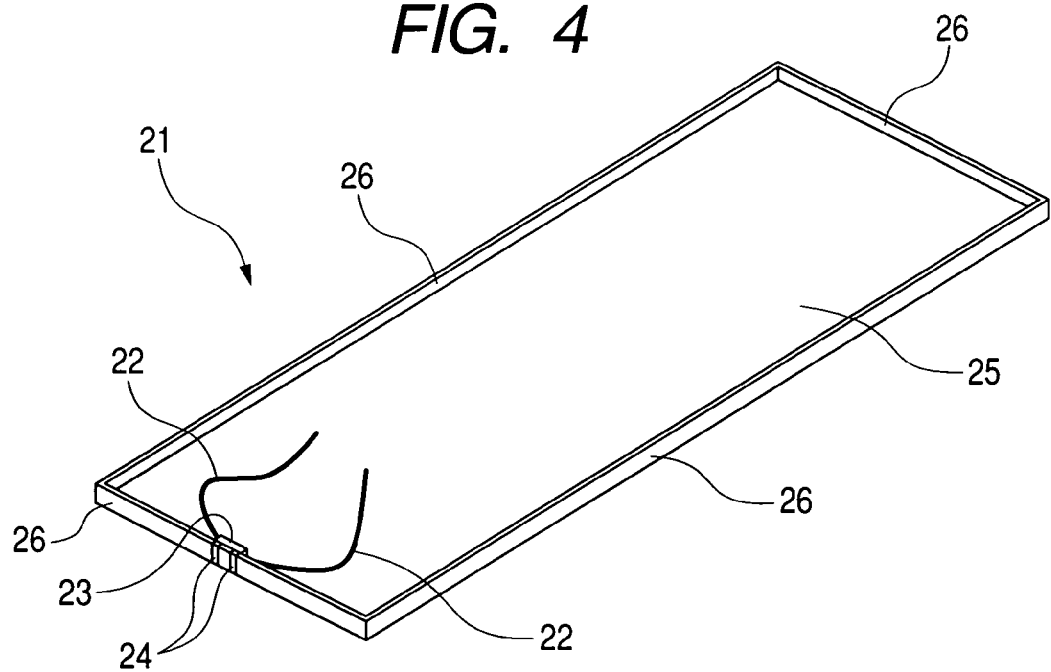
FIG. 4 is a schematic perspective view showing the solar cell module of Example 1 in a state as viewed from the non-light-receiving side.
Figure 5:
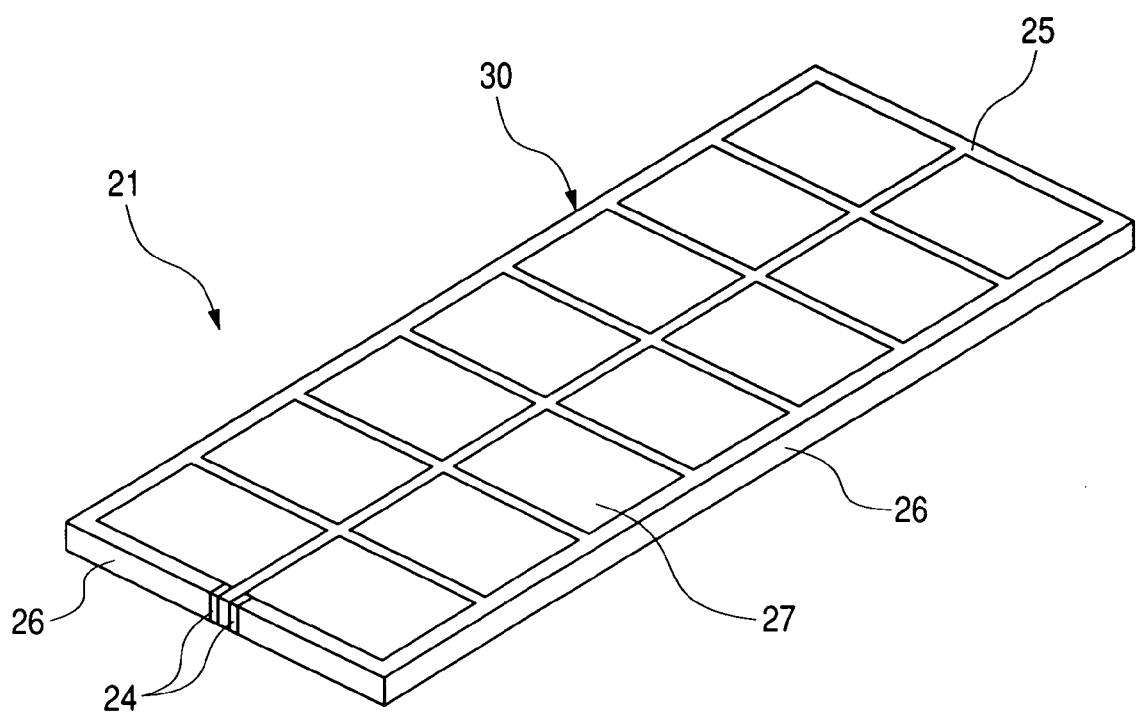
FIG. 5 is a schematic perspective view showing the solar cell module of Example 1 in a state as viewed from the light-receiving side.
Figure 6:
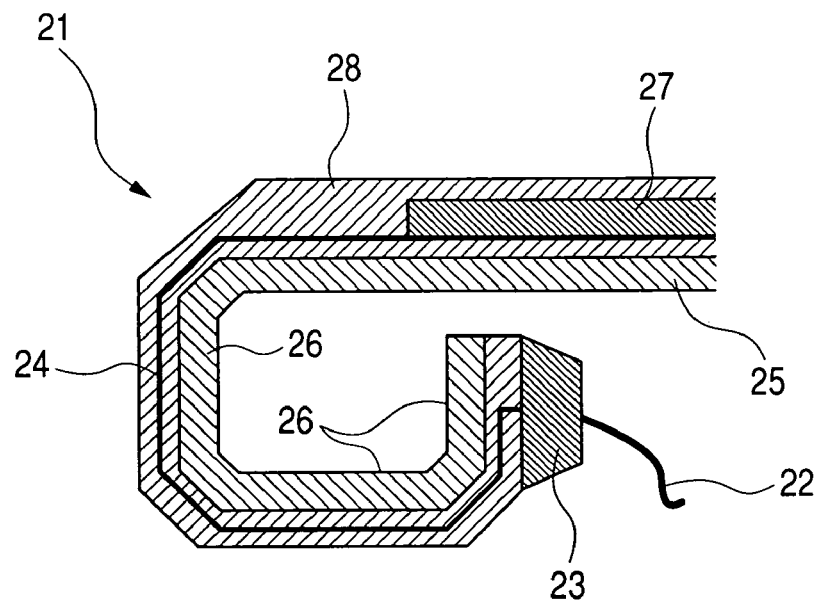
FIG. 6 is a schematic view showing a sectional structure of an output terminal portion of the solar cell module of Example 1.

FIG. 4 is a schematic perspective view showing a solar cell module of Example 1 in a state as viewed from the non-light-receiving side. FIG. 5 is a schematic perspective view showing the solar cell module of this example in a state as viewed from the light-receiving side. FIG. 6 is a schematic view showing a sectional structure of an output terminal portion of the solar cell module of this example. In these figures, the reference numeral 21 denotes a solar cell module, the reference numeral 22 a connector cable, the reference numeral 23 an output terminal box, the reference numeral 24 an output wire member, the reference numeral 25 a reinforcing member, the reference numeral 26 a bent portion of the reinforcing member, the reference numeral 27 an amorphous-microcrystalline stacked photovoltaic element, the reference numeral 28 a covering material, and the reference numeral 30 a solar cell panel.

As shown in the figures, in the solar cell module 21 of Example 1, the solar cell panel 30 having an amorphous-microcrystalline stacked photovoltaic element 27 covered with the covering material 28 made of ETFE, EVA and PET, and on the rear surface of this solar cell panel 30, a hot-dip Zn55%-Al alloy coated steel sheet (hereinafter referred to as "galvanized steel sheet"), which is the reinforcing member 25, is integrally stacked by means of the covering material 28, the bent portion 26 is formed in each of the four side edges of the galvanized steel sheet 25 toward the non-light-receiving surface side, the output wire member 24 having conductivity is extended from an output portion of the photovoltaic element 27 disposed on the light-receiving surface side of the solar cell panel 30 along a surface of the bent portion 26 to the leading end portion, and the edge of the extended portion of this output wire member 24 is exposed out of the covering material 28 to form an output terminal portion.

That is, in the solar cell module 21 of this example, each of the four side edges of the galvanized steel sheet 25 is each to form a pendent part toward the non-light-receiving surface side and this pendent part further has a second pendent part that is further bent in the letter "U" shape toward the non-light-receiving surface side, which is the rear surface of the solar cell module. The output terminal box 23 is provided at this second pendent part and the connector cable 22 is electrically connected to the output terminal portion (not shown) that is exposed within the output terminal box 23.

The electricity generated in the photovoltaic element 27 is derived through the output wire member 24 that extends from the output portion of this photovoltaic element 27 along the surface of the bent portion 26 to the output terminal portion.

Figure 7:
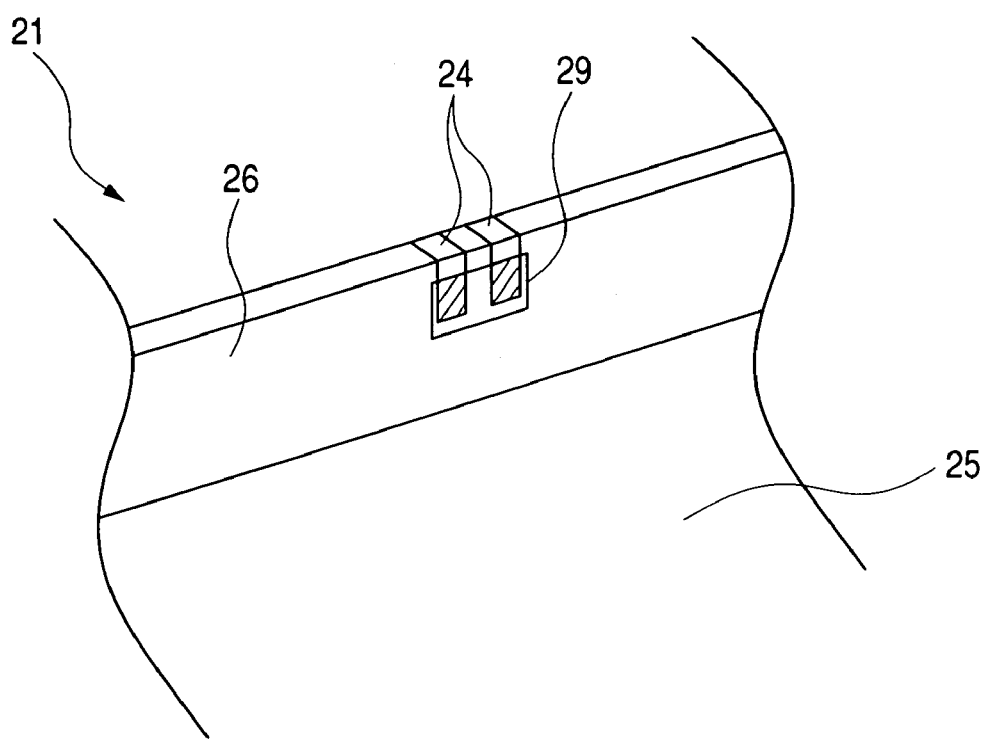
FIG. 7 is a schematic partial perspective view showing the output terminal portion of the solar cell module of Example 1 in a state as viewed from the non-light-receiving side.
Figure 8:
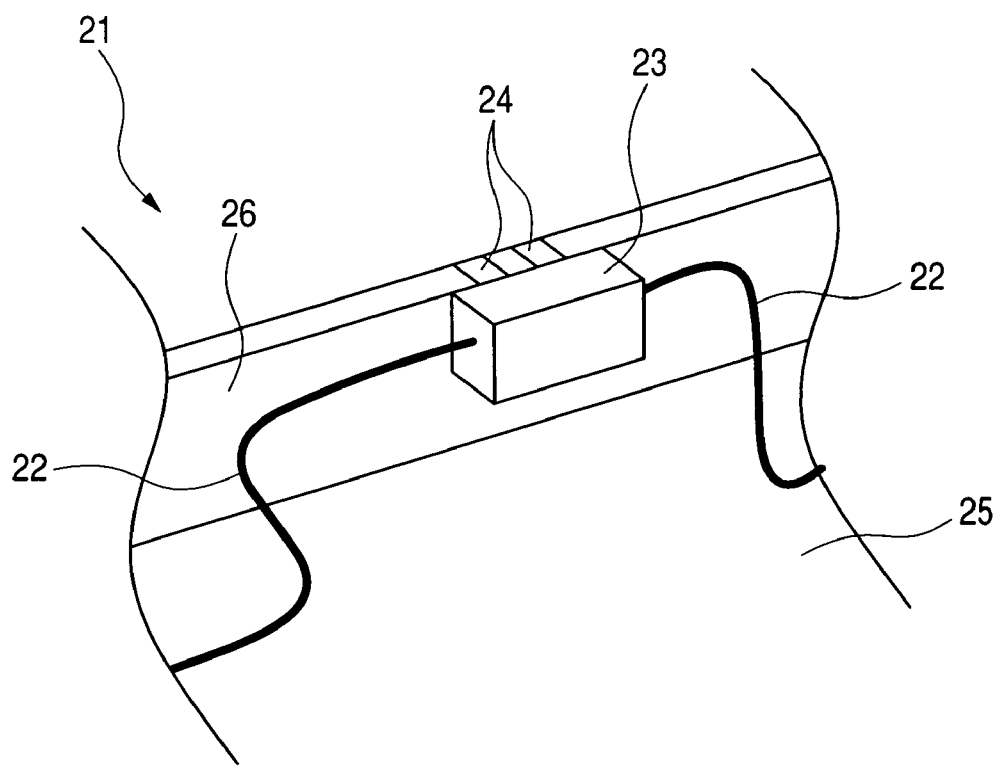
FIG. 8 is a schematic partial perspective view showing the output terminal portion of the solar cell module of Example 1 in a state in which an output terminal box is provided, as viewed from the non-light-receiving side.

FIG. 7 is a schematic perspective view showing an output terminal portion in a solar cell module of this example in a state as viewed from the non-light-receiving side. FIG. 8 is a schematic perspective view showing an output terminal portion of the solar cell module of this example in a state as viewed from the non-light-receiving side. The reference numeral 21 denotes a solar cell module, the reference numeral 22 a connector cable, the reference numeral 23 an output terminal box, the reference numeral 24 an output wire member, the reference numeral 25 a galvanized steel sheet, the reference numeral 26 a bent portion of the galvanized steel sheet, and the reference numeral 29 an output terminal portion.

As shown in the figures, the leading edge of the extended output wire member 24 is not covered with the covering material 28 and this extended output wire member 24 forms an output terminal portion 29 in a bare state. Further, the output terminal portion 29 of this output wires member 24 and the connector cable 22 are electrically connected to each other and the electricity generated in the photovoltaic element 27 is taken out to outside the solar cell module 21.

According to this construction, unlike conventional techniques, it is unnecessary to perform the troublesome step that involves providing a through hole in the reinforcing member, making a cutout in the covering material, and drawing out the wiring member from there, and it is possible to easily perform the electrical connection between the output terminal portion 29 of the output wire member 24 and the connector cable 22. Further, because the output terminal box 23 is provided on the non-light-receiving surface side of the bent portion 26 of the galvanized steel sheet 25, it is possible to prevent the degradation of the output terminal box 23 by light and to keep the reliability of the solar cell module 21. Besides, because the output terminal portion 29 is formed in the region on the non-light-receiving surface side, which is the rear surface of the solar cell module 11, it is unnecessary to provide the output terminal box 23 in a protruding manner outside the solar cell module 21, thus making it possible to prevent breakage due to catching during installation work and lowering in insulating properties.

Figure 9:
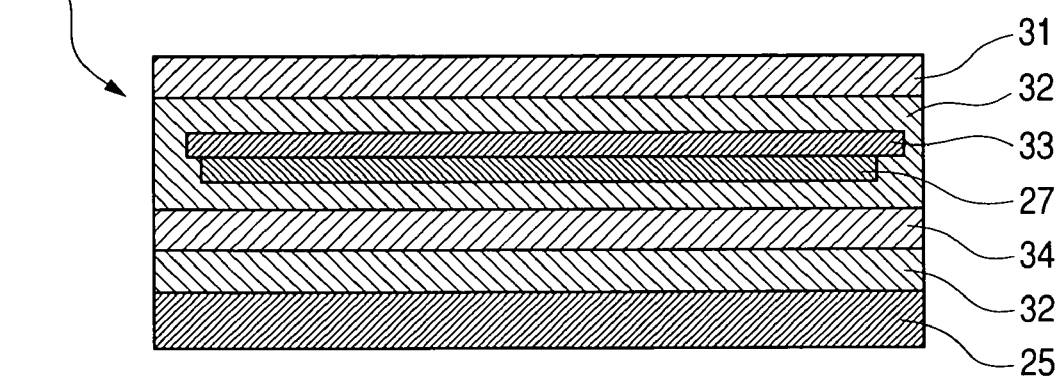
FIG. 9 is a schematic sectional view showing a covering structure of the solar cell module of Example 1.

FIG. 9 is a schematic sectional view showing the covering structure of the solar cell module of this example. In FIG. 9, the reference numeral 21 denotes the solar cell module, the reference numeral 25 the galvanized steel sheet, the reference numeral 27 the amorphous-microcrystalline stacked photovoltaic element, the reference numeral 31 an ETFE resin, the reference numeral 32 an EVA resin, the reference numeral 33 glass fiber, and the reference numeral 34 a PET resin.

As shown in the figure, the glass fiber 33 to improve scratch resistance is provided substantially only in the region of the light-receiving surface of the amorphous-microcrystalline stacked photovoltaic element 27 because the glass fiber 33 will change its color to white when subjected to bending working, and the ETFE resin 31 is disposed on the front surface side of these photovoltaic element 27 and glass fiber 33, and the PET resin 34 is disposed on the rear surface side thereof. Further, the EVA resin 32 is sealed between the ETFE resin 31 and the PET resin 34, and the galvanized steel sheet as the reinforcing member 25 is integrally stacked on the rearmost surface by use of the EVA resin 32.

The solar cell module 21 can accurately hold insulating properties owing to this integrally stacked structure. In addition, because the various materials become integral with each other, it is also possible to remarkably improve the strength of the solar cell module itself. However, the covering material 28 is not stacked on the output terminal portion 29 of the edge of the extended portion of the output wire member 24, and this output wire member 24 is exposed outside and electrically connected to the connector cable 22.

Figure 10:
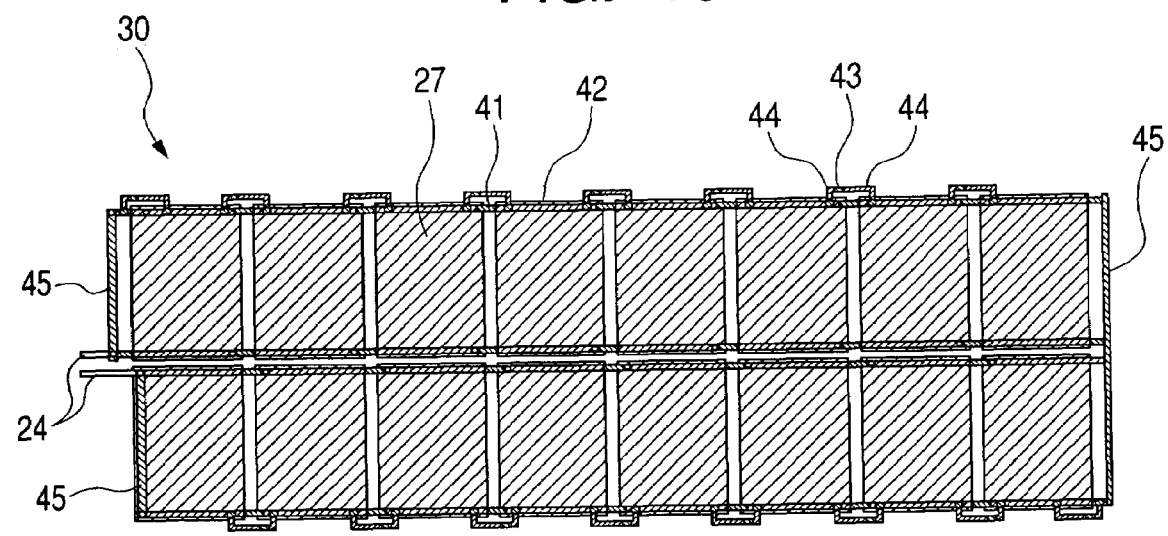
FIG. 10 is a schematic view showing the structure of the solar cell panel in the solar cell module of Example 1 in a state as viewed from the non-light-receiving side.

FIG. 10 is a schematic view showing the structure of the solar cell panel of the solar cell module of this example in a state as viewed from the non-light-receiving side. The reference numeral 24 denotes the output wire member, the reference numeral 27 the amorphous-microcrystalline stacked photovoltaic element, the reference numeral 30 the solar cell panel, the reference numeral 41 a positive terminal of the amorphous-microcrystalline stacked photovoltaic element, the reference numeral 42 a negative terminal of the amorphous-microcrystalline stacked photovoltaic element, the reference numeral 43 a Schottkey barrier type diode, the numeral 44 a Schottkey barrier type diode terminal, and the reference numeral 45 an interconnector.

In this example, 16 amorphous-microcrystalline stacked photovoltaic elements are connected in series to form a photovoltaic element group, and the Schottky barrier type diode 43 is provided for each of the amorphous-microcrystalline stacked photovoltaic elements.

In each amorphous-microcrystalline stacked photovoltaic element 27, the positive terminal 41 is disposed on the light-receiving surface of a solar cell panel 30, and a part thereof extends from the amorphous-microcrystalline stacked region and is connected by soldering in series to the negative terminal 42 disposed on the non-light-receiving surface side of the adjacent photovoltaic element 27. Moreover, the diode 43 is connected so as to bridge the photovoltaic elements. By performing electrical connection with this constitution, members that are electrically connected to the positive terminal and negative terminal of one photovoltaic element 27 are electrically connected together on the rear surface of the solar cell panel 30. For this reason, it is possible to perform the installation work of the diode 43 only on the rear surface side of the solar cell panel 30, thereby remarkably improving the workability of the mounting.

As a result of this, it is possible to provide a high-reliability, inexpensive solar cell module of which the workability of electrical wiring and electrical connection during manufacturing is remarkably improved, the area efficiency is improved and lowering in insulating properties is prevented.

EXAMPLE 2

Figure 11:
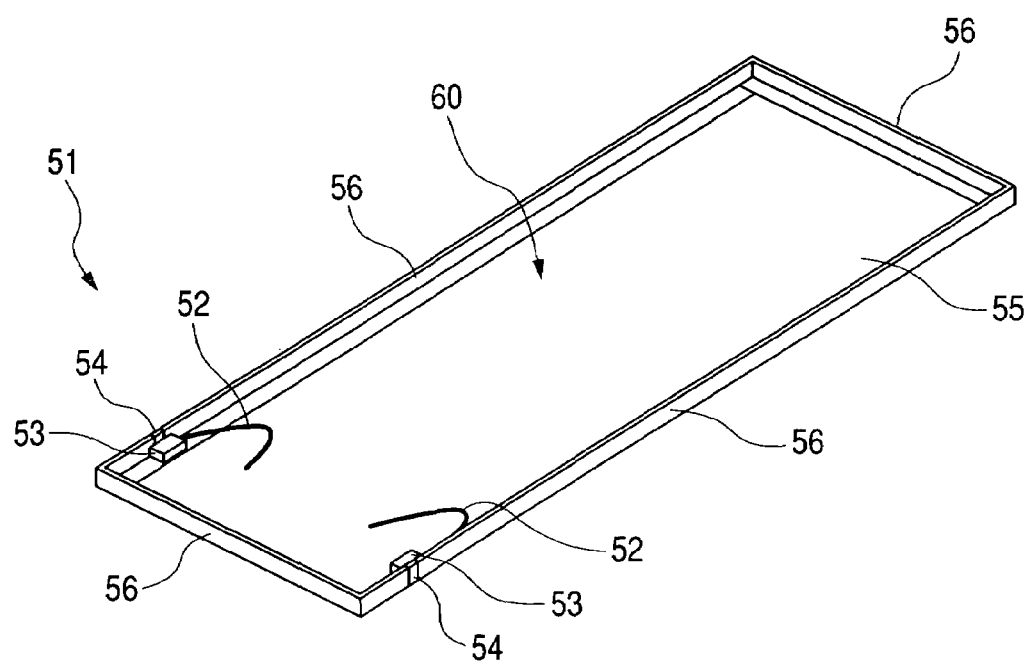
FIG. 11 is a schematic perspective view showing the solar cell module of Example 2 in a state as viewed from the non-light-receiving side.
Figure 12:
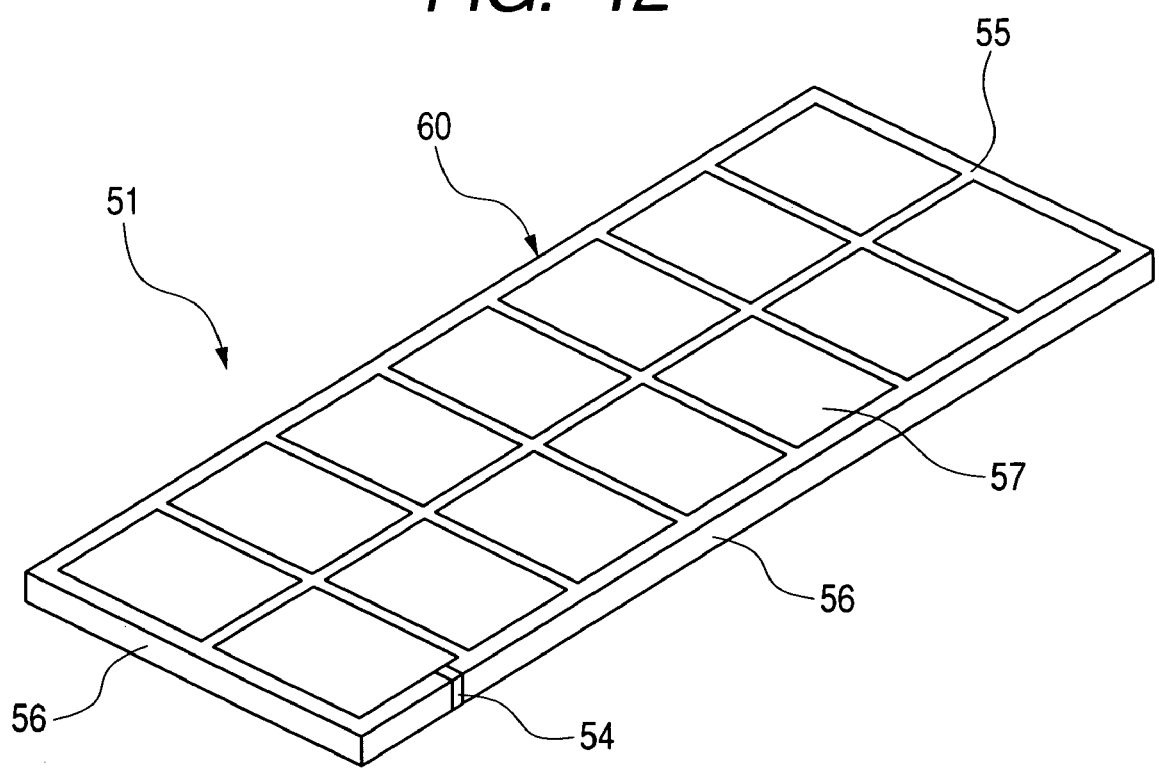
FIG. 12 is a schematic perspective view showing the solar cell module of Example 2 in a state as viewed from the light-receiving side.
Figure 13:
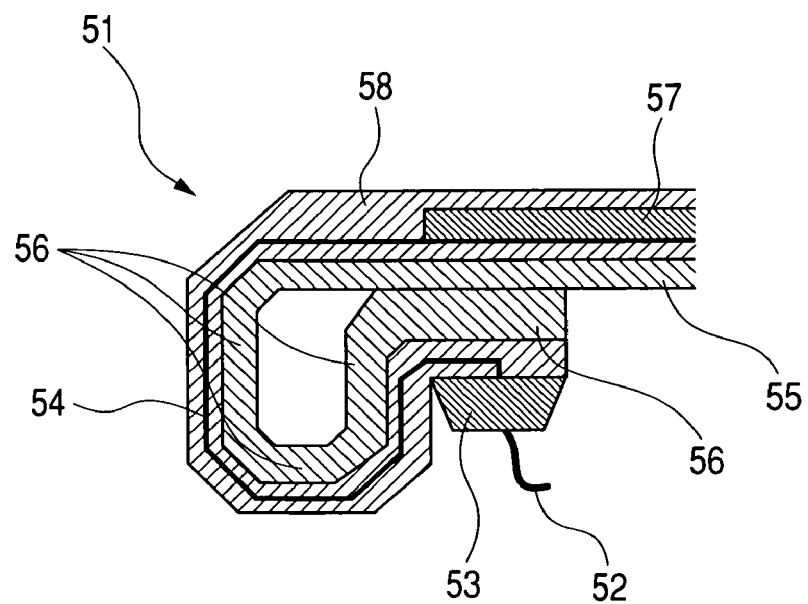
FIG. 13 is a schematic view showing a section structure of an output terminal portion of the solar cell module of Example 2.

FIG. 11 is a schematic perspective view showing a solar cell module of Example 2 in a state as viewed from the non-light-receiving side. FIG. 12 is a schematic perspective view showing the solar cell module of this example in a state as viewed from the light-receiving side. FIG. 13 is a schematic view showing the sectional structure of an output terminal portion of the solar cell module of this example. In these figures, the reference numeral 51 denotes a solar cell module, the reference numeral 52 a connector cable, the reference numeral 53 an output terminal box, the reference numeral 54 an output wire member, the reference numeral 55 a galvanized steel sheet, the reference numeral 56 a bent portion of the galvanized steel sheet, the reference numeral 57 an amorphous-microcrystalline stacked photovoltaic element, the reference numeral 58 a covering material, and the reference numeral 60 a solar cell panel.

As shown in the figures, in the solar cell module 51 of Example 2, the solar cell panel 60 having the amorphous-microcrystalline stacked photovoltaic element 57 covered with the covering material 58 made of ETFE, EVA and PET, and on the rear surface of this solar cell panel 60, a galvanized steel sheet, which is the reinforcing member 55, is integrally stacked by means of the covering material 58, the bent portion 56 is formed in each of the four side edges of the galvanized steel sheet 55 toward the non-light-receiving surface side, a part of this bent portion 56 on the tip portion side abuts against a part of the rear surface (the non-light-receiving surface) of the reinforcing member 55, the output wire member 54 having conductivity is extended from an output portion of the photovoltaic element 57 disposed on the light-receiving surface of the solar cell panel 60 along a surface of the bent portion 56 to the leading end portion, and the edge of the extended portion of this output wire member 54 is exposed out of the covering material 58 to form an output terminal portion.

A part of the bent portion 56 on the tip-portion side abuts against a part of the rear surface (the non-light-receiving surface) of the reinforcing member 55, the output terminal portion is exposed at this abutting leading end portion, the output terminal portion and a connector cable 52 are electrically connected to each other, and this electrical connecting portion is covered with the output terminal box 53, in which a filler is filled. Further, in this example, a conductive, output wire member 54 is extended from each of output portions of positive and negative terminals of the amorphous-microcrystalline stacked photovoltaic element 57 along the surface of each of the opposing end portions of the bent portion 56 to the leading end portion and the edges of the extended portions of the output wire members 54 are exposed out of the covering material 58 to form output terminal portions, the output terminal portions and the connector cables 52 are electrically connected to each other respectively, and the electrical connecting portions are covered with the output terminal boxes 53 respectively, which are each filled with a filler. Therefore, the electrical connection work during the manufacturing of the solar cell module 51 becomes easy and workability is further improved. Furthermore, in this example, because the leading end portion of the bent portion 56 of the reinforcing member 55 is bent toward the non-light-receiving surface side, which is the rear surface of the solar cell panel 60, so that a part of the bent portion 56 on the tip portion side abuts against a part of the rear surface (non-light receiving surface) of the reinforcing member 55, the output terminal box 53 can be disposed within the internal space (i.e., recess) on the non-light-receiving side of the solar cell panel 60, so that the output terminal portion is less likely to be photodegradated, thus making it possible to keep weather resistance for a long period of time.

Therefore, it is possible to provide a high-reliability, low-cost solar cell module of which the workability of electrical wiring and electrical connection during manufacturing is remarkably improved, damage to the output terminal portion due to catching and the like during installation can be prevented, the area efficiency of the photovoltaic element 57 with respect to the light-receiving surface of the solar cell module 51 can be improved and lowering in insulating properties is prevented.

What is claimed is:

1. A solar cell module having a reinforcing member integrally stacked by means of a covering material on a rear surface of a solar cell panel having a photovoltaic element that performs photoelectric conversion, wherein a bent portion is formed in each of opposing end portions of the reinforcing member, an output wire member having conductivity is extended from an output portion of the photovoltaic element along a surface of the bent portion so as to get over the bent portion, and a tip end of the extended portion of the output wire member is exposed out of a surface opposite to the reinforcing member of the covering material to form an output terminal portion, wherein the photovoltaic element is disposed on a light-receiving surface side of the reinforcing member, wherein the reinforcing member is a metal sheet selected from the group consisting of a hot-dip aluminum coated steel sheet, a hot-dip zinc coated steel sheet, a hot-dip zinc-aluminum alloy coated steel sheet, and a stainless steel sheet.

2. The solar cell module according to claim 1, wherein the constitution of the covering material that is present in a region on a light-receiving surface side of the solar cell panel is different from the constitution of the covering material that is present in a region ranging from the bent portion of the reinforcing member to the end portion of the reinforcing member.

3. The solar cell module according to claim 1, wherein the covering material that is present in a region ranging from the bent portion to the end portion of the reinforcing member is thinner than the covering material that is present in a region on a light-receiving surface side of the solar cell panel.

4. The solar cell module according to claim 1, wherein a part of the bent portion of the reinforcing member on a leading end side is further bent toward a non-light-receiving surface which is a rear surface of the solar cell panel.

5. The solar cell module according to claim 1, wherein a connector cable is electrically connected to an output terminal portion of the solar cell module, an electrical connecting portion of the solar cell module is covered with an output terminal box, and a filler is filled in the output terminal box.

6. The solar cell module according to claim 5, wherein the output terminal box is disposed on a non-light-receiving surface side of the solar cell panel.

* * * * *